United States Patent
Ahn

[19]

[11] Patent Number: 5,804,491
[45] Date of Patent: Sep. 8, 1998

[54] COMBINED FIELD/TRENCH ISOLATION REGION FABRICATION METHODS

[75] Inventor: Dong-ho Ahn, Kyungki-do, Rep. of Korea

[73] Assignee: Samsung Electronics Co., Ltd., Suwon, Rep. of Korea

[21] Appl. No.: 744,436

[22] Filed: Nov. 8, 1996

[51] Int. Cl.$^6$ .................................................. H01L 21/76
[52] U.S. Cl. ......................... 438/425; 438/424; 438/427; 438/426
[58] Field of Search ................................. 438/424, 425, 438/427, 444; 148/DIG. 50

[56] References Cited

U.S. PATENT DOCUMENTS

| | | | |
|---|---|---|---|
| 4,842,675 | 6/1989 | Chapman et al. | 148/DIG. 50 |
| 5,372,968 | 12/1994 | Lur et al. | 438/427 |
| 5,472,904 | 12/1995 | Figura et al. | 148/DIG. 50 |
| 5,498,566 | 3/1996 | Lee | 438/427 |
| 5,679,599 | 10/1997 | Mehta | 438/425 |
| 5,728,620 | 3/1998 | Park | 438/425 |

*Primary Examiner*—Trung Dang
*Attorney, Agent, or Firm*—Myers Bigel Sibley & Sajovec

[57] ABSTRACT

Isolation regions are fabricated on a substrate by forming a pattern region on the substrate, exposing spaced apart first and second areas of the substrate. The second area is then covered, preferably using sidewall spacers formed adjacent sidewall portions of the pattern region, while a portion of the first area is left exposed. A first insulation region is then formed on the exposed portion of the first area. The second area is then exposed and a trench isolation region is formed at the second area. Preferably, the pattern region is formed by forming a masking layer on the substrate and patterning the masking layer using a single photolithographic mask. The first insulation layer preferably is formed by thermally oxidizing the exposed portion of the first area. Preferably, the first area is wider than the second area.

21 Claims, 5 Drawing Sheets

COMBINED FIELD/TRENCH ISOLATION REGION FABRICATION METHODS

FIELD OF THE INVENTION

The present invention relates to microelectronic device fabrication methods, in particular, to methods for forming isolation regions in microelectronic devices.

BACKGROUND OF THE INVENTION

As the density of integration of semiconductor devices has increased, the feature size of devices has become correspondingly smaller. Thus, for example, 0.45 micron technology is typically used to fabricate 64 Megabit (M) dynamic random access memory (DRAM) devices, while 0.25 micron technology is typically used for 256M DRAMs. Typically, formation of device isolation regions is a critical step in fabrication of semiconductor devices, as the size of these isolation regions tends to impact the size of active regions and processing margins for subsequent processing steps.

Techniques for forming isolation regions include trench isolation techniques and field isolation techniques using local oxidation of silicon (LOCOS). A LOCOS isolation technique is illustrated by FIGS. 1A–1B. A pad oxide layer 3 and a nitride layer 5 are stacked on a silicon substrate 1. A portion of the nitride layer 5 is removed, leaving an exposed field region 9. A channel stopping ion implantation 7 is then implanted into the field region 9 to define a non-active region in the field region 9 and an active region 11, as shown in FIG. 1A. Referring to FIG. 1B, a thermal oxidation process is then performed to form a field oxide layer 13.

According to this technique, both sides of the pad oxide layer 3 adjacent to the field region 9 typically are oxidized toward the active region during the thermal oxidation process, forming a structure commonly known as a "bird's beak." The bird's beak 19 effectively increases the width of the field oxide 20, compared to the initial width 17 of the field region 9, thus decreasing the width of the active region 23. The bird's beak phenomenon can limit the degree to which the density of integration of a device can be reduced. Because the field oxide layer thermally typically grows to an average thickness of 5,000 Å, a crystal defect can also occur near the boundary between the active region and the non-active region due to mechanical stress produced by the growth, leading to increased leakage current between active regions. In addition, the thermal oxidation process can cause an unwanted redistribution of the implanted impurity ions.

Trench isolation techniques can avoid some of the problems associated with LOCOS techniques. Trench isolation techniques may be particularly better suited for forming narrow isolation regions for which LOCOS techniques are not particularly suitable. As illustrated by FIGS. 2A–D, a conventional trench isolation technique includes growing a pad oxide layer 2 on a silicon substrate 1, typically to a thickness of about 240 Å, by thermal oxidation. A nitride layer 4 is then formed, typically to a thickness of 1,500 Å. A high-temperature thermal oxide layer 6 is then formed to a thickness of about 1,000 Å, typically by a low pressure chemical vapor deposition (LPCVD) method. The high-temperature thermal oxide layer is then patterned, typically using a dry etching technique.

Referring to FIG. 2B, the nitride layer 4 and the pad oxide layer 2 are then etched by a reactive ion etching or other method, using the patterned high-temperature thermal oxide layer as an etching mask. Subsequently, the silicon substrate 1 is etched, typically using a dry etching technique, to form trenches. A sidewall oxide layer 8 is then formed within each trench by thermal oxidation, and polysilicon 10 is deposited on the entire structure to a thickness of 5,000 Å or more. An anisotropic etching is then performed to remove the polysilicon 10 from all but the trenches. As illustrated, the anisotropic etching process tends to leave narrow trenches mostly filled while leaving a significant depression in wider trenches.

Referring to FIG. 2C, a field oxide layer 12 is then formed on the polysilicon in the trenches by a thermal oxidation method. As illustrated, the depression in the polysilicon layer in the wider trenches is reflected in the overlying field oxide layer, however. As shown in FIG. 2D, the high-temperature thermal oxide layer, the nitride layer and the pad oxide layer are then wet-etched using a buffered oxide etchant (BOE) or a phosphate solution. Thereafter, a sacrificial oxide layer may then be grown and wet-etched to complete the device isolation process.

Although trench isolation techniques can be effective for forming narrow isolation regions, they can have several drawbacks. Subsequently formed gate and bit lines may be shorted or deteriorated due to depressions formed in the polysilicon at the center of wider trenches. Also, a bird's beak phenomenon occurring during formation of the field oxide layer on the trenches can prevent further reduction in the width of the trench isolation region. In addition, when etching the high-temperature thermal oxide layer during the BOE operation, a portion of the field oxide layer may also be etched away, which may require an increase in the thickness of the field oxide layer to maintain process margin. As a result, the bird's beak phenomenon may be exacerbated.

A trench isolation technique using chemical mechanical polishing (CMP) has been developed. An advantage of this technique is that thermal oxidation may not be required, thus avoiding some of the problems associated with LOCOS. Unfortunately, however, this technique tends to suffer from several difficulties, including difficulty in filling trenches without creating voids, difficulty in densifying the filling material, and an undesirable "dishing" phenomena occurring during polishing of the filling material in wider trenches.

Because of the difficulties involved in using trench and field isolation techniques alone, a combined trench and LOCOS technology has been developed. Typically, the cells of a narrow cell array region are isolated using trench isolation, and the active and non-active regions of a wider peripheral circuit region are isolated by a LOCOS method, respectively. Unfortunately, the conventional combined technique generally requires separate photolithography processes for forming narrow and wide isolation regions. If trenches are to be aligned, fabrication of multiple masks may be required, thus complicating the manufacturing process, increasing costs and further reducing processing margins.

SUMMARY OF THE INVENTION

In light of the foregoing, it is an object of the present invention to provide methods of fabricating narrow and wide device isolation regions with fewer defects.

In light of the foregoing, it is an object of the present invention to provide less complex methods of fabricating narrow and wide device isolation regions.

These and other objects, features and advantages are provided according to the present invention by fabrication methods in which narrow trench and wide field isolation regions are formed from a single photolithographic pattern defining narrow and wide areas on the substrate. The narrow areas are masked during formation of the field isolation regions on the wide areas using sidewall spacers which are subsequently removed before forming trench isolation regions at the narrow areas. Using field isolation techniques in the wide areas reduces the probability of dishing and other undesirable phenomena, while using trench isolation without local oxidation in the narrow areas helps prevent the formation of bird's beaks and stress defects.

In particular, according to the present invention, isolation regions are fabricated on a substrate by forming a pattern region on the substrate, exposing spaced apart first and second areas of the substrate. The second area is then covered, preferably using sidewall spacers formed adjacent sidewall portions of the pattern region, while a portion of the first area is left exposed. A first insulation region is then formed on the exposed portion of the first area. The second area is then exposed and a trench isolation region is formed at the second area. Preferably, the pattern region is formed by forming a masking layer on the substrate and patterning the masking layer using a single photolithographic mask. The first insulation layer preferably is formed by thermally oxidizing the exposed portion of the first area. Preferably, the first area is wider than the second area.

The trench isolation region preferably is formed by forming a trench at the exposed second area, and then forming an insulation layer filling the trench and covering the pattern region and the first insulation region. The substrate is then planarized to form a second insulation region in the trench. Before forming the insulation layer, exposed portions of the substrate in the trench preferably are thermally oxidized. Preferably, the pattern region is formed by forming a barrier layer on the substrate, forming a first insulation layer on the barrier layer, and patterning the barrier layer and the first insulation layer to form a pattern region on the substrate. The substrate may be subsequently planarized using the barrier layer as a polishing or etching stop.

According to a preferred method aspect, isolation regions are formed on a substrate by forming a pattern region on the substrate, exposing spaced apart first, second and third areas of the substrate, covering the second and third areas while leaving exposed at least a portion of the first area, forming a first insulation region on the exposed portion of the first area, exposing the second and third areas, and subsequently forming a trench isolation region in the substrate, the trench isolation region spanning the second and third areas. The trench isolation region is formed by forming two spaced apart trenches, each of the trenches being formed at a respective one of the second and third areas, removing portions of the substrate between the two trenches to form a single trench, and forming a second insulation region in the single trench.

BRIEF DESCRIPTION OF THE DRAWINGS

Some of the objects and advantages of the present invention having been stated, others will be more fully understood from the detailed description that follows and by reference to the accompanying drawings in which.

DETAILED DESCRIPTION OF THE INVENTION

Figure 1A:
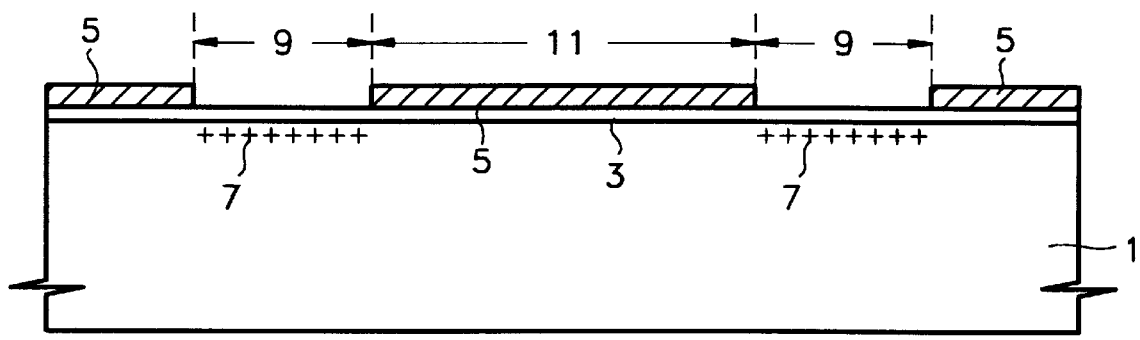
FIGS. 1A–B are cross-sectional views of fabrication products illustrating a field isolation technique according to the prior art.
Figure 1B:
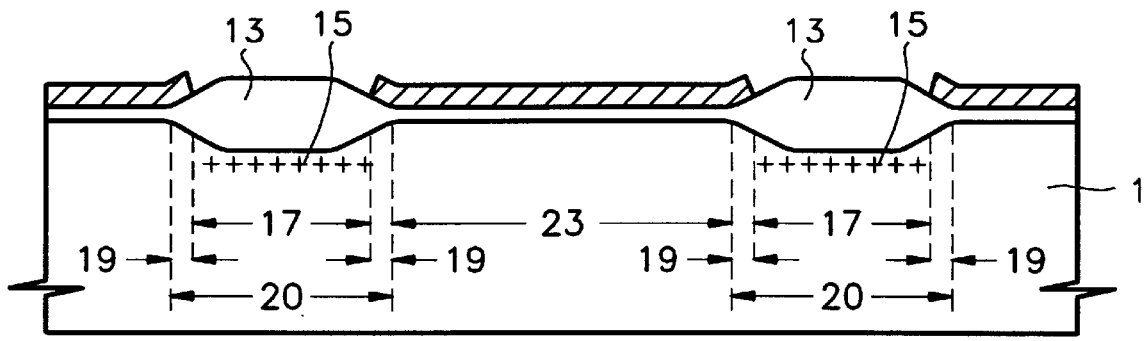
Figure 2A:
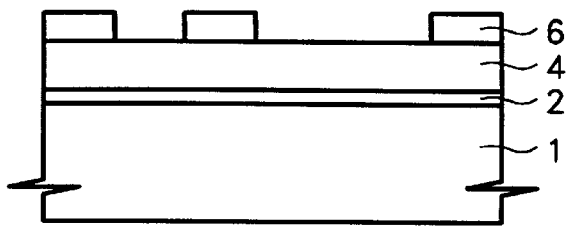
FIG. 2A–D are cross-sectional views of fabrication products illustrating a trench isolation technique according to the prior art.
Figure 2B:
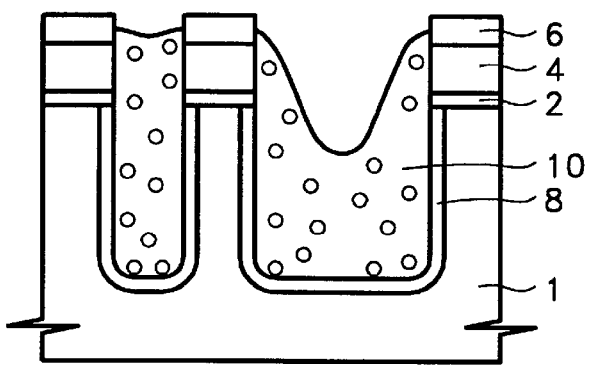
Figure 2C:
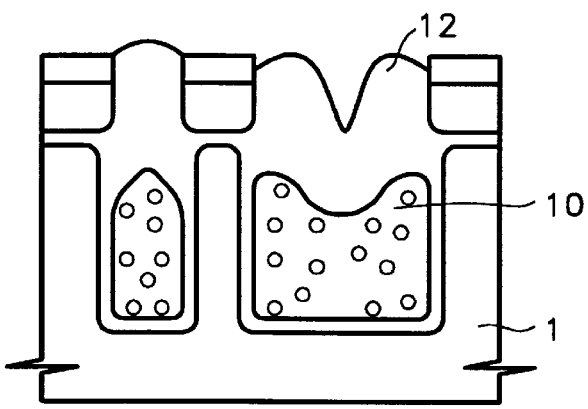
Figure 2D:
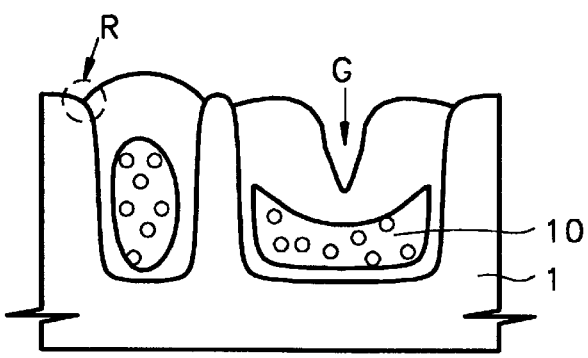

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity, and like numbers refer to like elements throughout.

Figure 3:
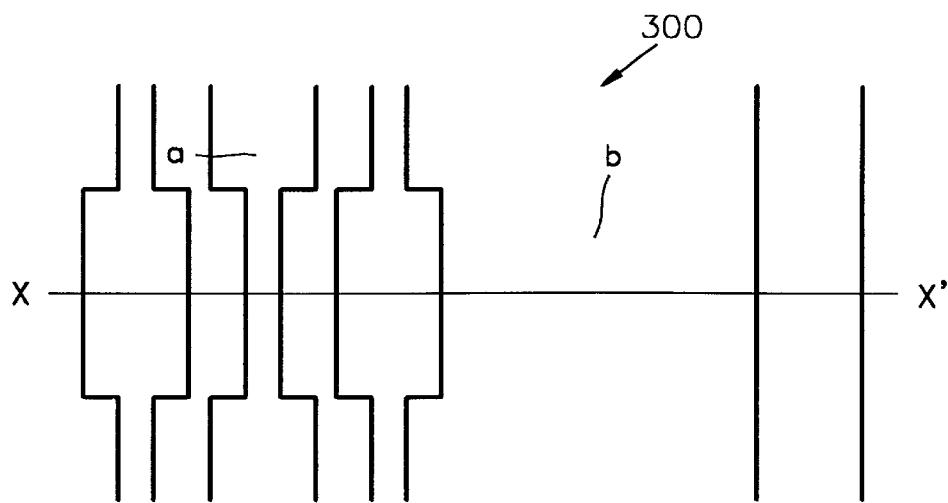
FIG. 3 is a plan view illustrating active and non-active regions on a substrate according to the present invention.

FIG. 3 is a plan view of a semiconductor device 300 including active regions a and non-active regions b. FIGS. 4A–H are cross-sectional views of the semiconductor device 300 of FIG. 3, cut along a line X—X', illustrating a preferred method aspect according to the present invention. A first region A represents a cell array region including narrow active and non-active regions, and a second region B represents a peripheral circuit region including wide non-active and active regions.

Figure 4A:
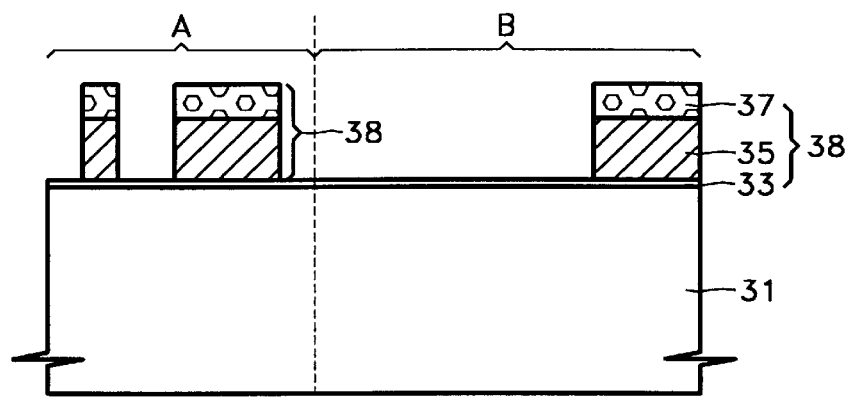
FIG. 4A–H are cross-sectional views of intermediate fabrication products illustrating a preferred combined field/trench isolation region fabrication method according to the present invention.

Referring to FIG. 4A, a silicon dioxide layer 33 is grown on a substrate 31, e.g., a silicon substrate, preferably by thermal oxidation of the substrate 31 to a thickness of about 40Å. A silicon nitride barrier layer 35 is formed on the silicon dioxide layer 33 to a thickness of approximately 1,500 Å to approximately 2,500 Å. A second silicon dioxide layer 36 is then formed, preferably by low pressure chemical vapor deposition (CVD) to a thickness of approximately 300 Å to approximately 700 Å. Subsequently, the nitride layer 35 and the second silicon dioxide layer 37 are patterned to form a pattern region 38 having the pattern of the plan view of FIG. 3, which leaves wide and narrow areas of the first silicon dioxide layer 33 exposed. Preferably, the patterning is performed using a single photolithography mask, simplifying fabrication and allowing fabrication of the device without subsequent alignment of masks.

Figure 4B:
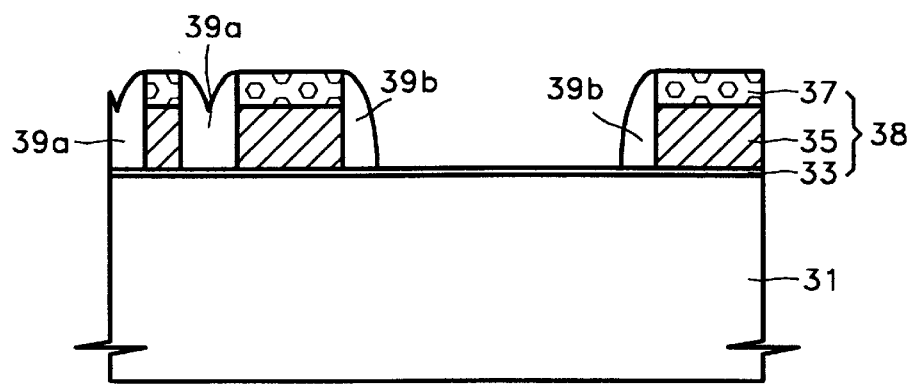
Figure 4C:
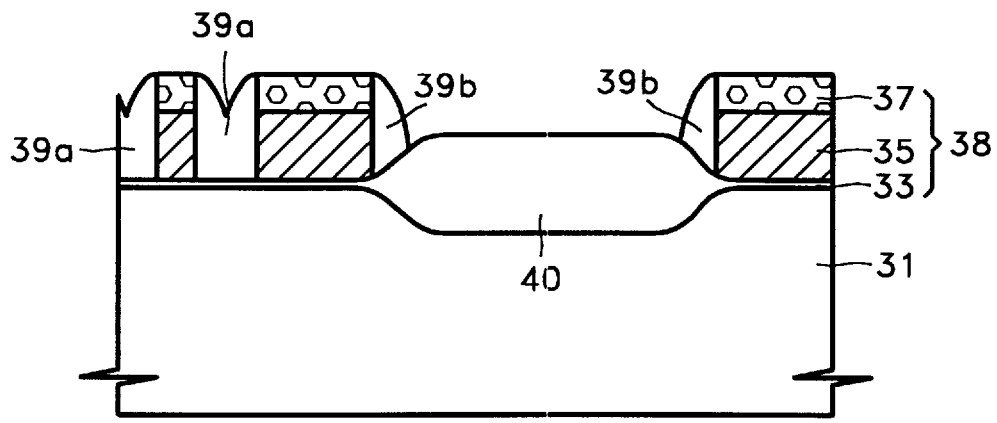

Referring now to FIG. 4B, a silicon nitride barrier layer is then formed on the substrate, covering the pattern region 38 and the exposed areas of the first silicon dioxide layer 33. The silicon nitride layer is then etched back using the second silicon dioxide layer 37 and the first silicon dioxide layer 33 as an etching stop. As shown in FIG. 4B, sidewall spacers 39a,39b are thus formed on sidewall portions of the pattern region 38, with the sidewall spacers 39a in the narrow areas merging to cover the narrow areas. In the wide areas, however, a portion of the first silicon dioxide layer 33 is left exposed between silicon nitride sidewall spacers 39b. As shown in FIG. 4C, with the silicon nitride sidewall spacers 39a,39b and the pattern region 38 serving as a mask, the exposed portion of the first silicon nitride layer 33 is then thermally oxidized to form an insulation region 40, preferably with a thickness of about 3,000 Å to about 5,000 Å.

Figure 4D:
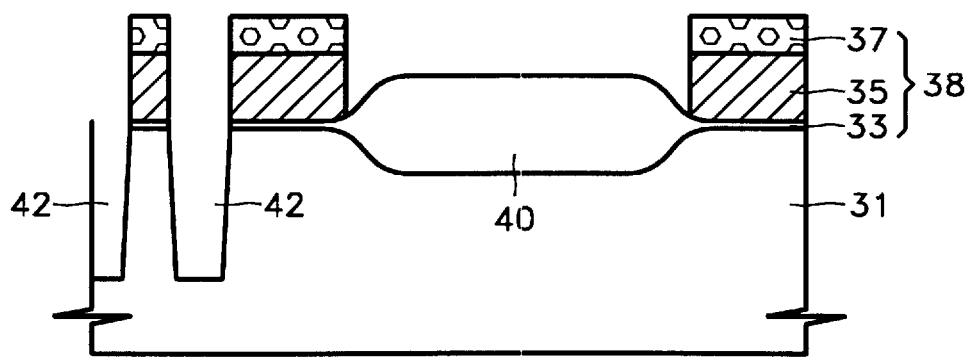
Figure 4E:
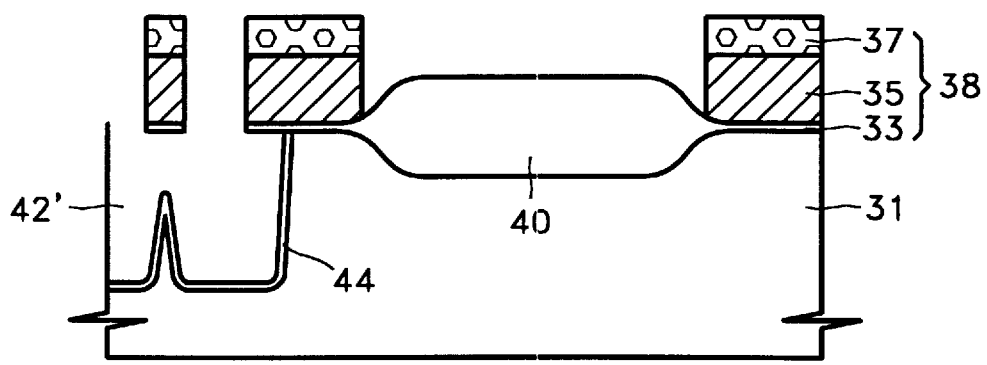

Referring to FIG. 4D, after removing the sidewall spacers 39a, 39b, the substrate 31 is then etched using the pattern region 38 as an etching mask, forming trenches 42 at the narrow areas. In the wide area, the second insulation region 40 serves as an etching barrier. The trenches 42 may then be merged to form a single trench 42', by isotropically etching the silicon substrate 31 between the trenches 42, for example, using a chemical dry etching (CDE) process, as illustrated in FIG. 4E. An insulation layer 44 is then formed on the substrate in the trench 42', preferably by thermal oxidation.

Figure 4F:
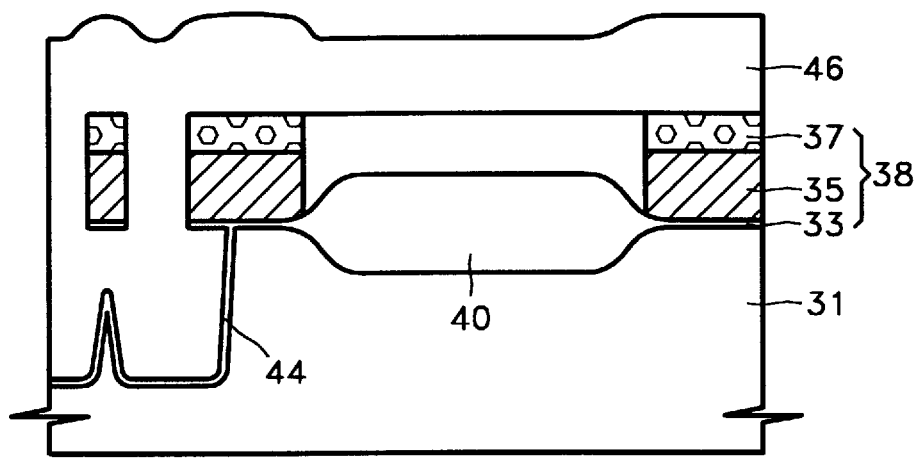
Figure 4G:
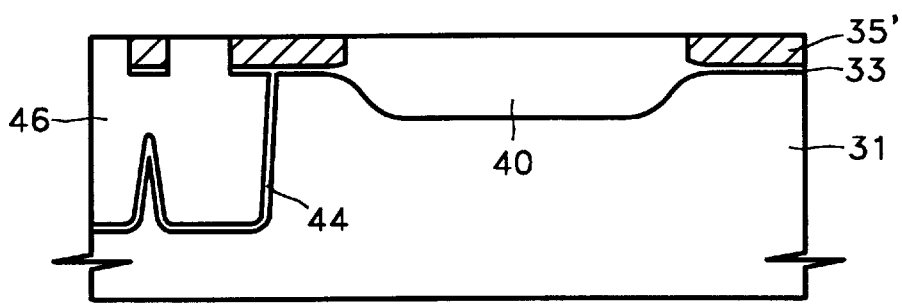

As shown in FIG. 4F, an insulation layer 46 is then formed on the substrate, filling the trench 42' and covering the insulation region 40 and the pattern region 38. Preferably, the insulation layer 46 is silicon dioxide deposited using an LPCVD or a plasma-enhanced CVD (PECVD) technique. Then, as shown in FIG. 4G, a chemical mechanical polishing (CMP) operation is performed until the surface of the silicon nitride layer 35 is exposed. In lieu of the CMP operation, a reactive ion etching or other operation may be performed. As the peripheral circuit region B is isolated using a field oxide region 40 without a step difference, instead of a filled trench isolation region with a central depressed area, the dishing phenomenon which frequently occurs in forming wide trench isolation regions can be avoided. If the field oxide region 40 is densified, dishing can be further decreased. In addition, the field oxide region 40 can be formed of a thermal oxide having a lower polishing speed than that of other oxide regions to aid in planarizing the substrate.

Figure 4H:
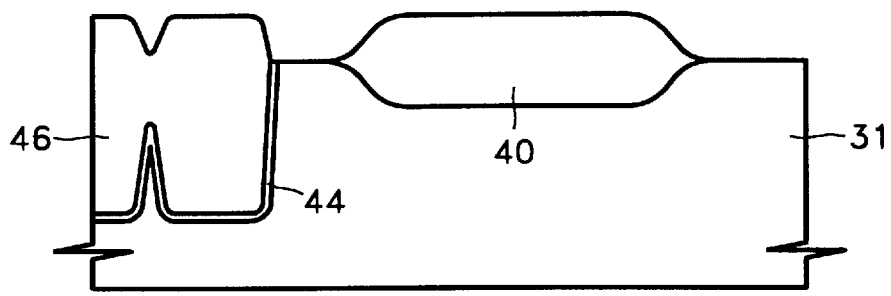

As shown in FIG. 4H, the remaining portions of the silicon nitride layer 35 and the first silicon dioxide layer 33 may be removed to leave a field isolation region 40 and a trench isolation region in the trench 44. Preferably, the silicon nitride layer 35 is removed by reactive ion etching, and the first silicon dioxide layer 35 is removed by wet-etching with a diluted hydrofluoric acid (HF) or a buffered oxide etchant (BOE).

Those skilled in the art will appreciate that the present invention includes a number of variations of the above-described operations. For example, a single narrow trench could be formed and filled, instead of forming closely-spaced narrow trenches and merging them as described above. Similarly, trenches of differing widths could be formed adjacent one another, merged, and filled as described with respect to the illustrated embodiments.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A method of fabricating isolation regions on a substrate, the method comprising the steps of:
   forming a pattern region on the substrate, exposing spaced apart first and second areas of the substrate;
   covering the second area while leaving exposed at least a portion of the first area;
   thermally oxidizing the exposed portion of the first area to thereby form a first insulation region on the exposed portion of the first area;
   exposing the second area; and
   forming a trench isolation region at the second area.

2. A method according to claim 1 wherein said step of forming a pattern region comprises the steps of:
   forming a masking layer on the substrate; and
   patterning the masking layer using a single photolithographic mask.

3. A method according to claim 1 wherein said step of forming a first insulation region comprises the step of thermally oxidizing the exposed portion of the first area to thereby form the first insulation region.

4. A method according to claim 1 wherein the first area is wider than the second area.

5. A method of fabricating isolation regions on a substrate, the method comprising the steps of:
   forming a pattern region on the substrate exposing spaced apart first and second areas of the substrate;
   covering the second area while leaving exposed at least a portion of the first area;
   forming a first insulation region on the exposed portion of the first area;
   exposing the second area;
   forming a trench in the substrate at the second area;
   forming an insulation layer filling the trench and covering the pattern region and the first insulation region; and
   planarizing the substrate to form a second insulation region in the trench.

6. A method according to claim 5, wherein said step of forming an insulation layer is preceded by the step of thermally oxidizing exposed portions of the substrate in the trench.

7. A method according to claim 5:
   wherein said step of forming a pattern region comprises the steps of:
     forming a barrier layer on the substrate;
     forming a first insulation layer on the barrier layer; and
     patterning the barrier layer and the first insulation layer to form a pattern region on the substrate, exposing spaced apart first and second areas of the substrate;
   wherein said step of planarizing the substrate comprises the step of chemical mechanical polishing the substrate using the barrier layer as a polishing stop.

8. A method according to claim 5:
   wherein said step of forming a pattern region comprises the steps of:
     forming a barrier layer on the substrate;
     forming a first insulation layer on the barrier layer; and
     patterning the barrier layer and the first insulation layer to form a pattern region on the substrate, exposing spaced apart first and second areas of the substrate;
   wherein said step of planarizing the substrate comprises the step of reactive ion etching the substrate using the barrier layer as an etching stop.

9. A method according to claim 1:
   wherein said step of covering the second area comprises the step of forming sidewall spacers adjacent sidewall portions of the pattern region, covering the second area and leaving exposed a portion of the first area between sidewall spacers; and
   wherein said step of exposing the second area comprises the step of removing the sidewall spacers covering the second area.

10. A method according to claim 1 wherein the substrate includes a silicon region and a silicon dioxide layer at an upper surface thereof.

11. A method of fabricating isolation regions on a substrate, the method comprising the steps of:
   forming a pattern region on the substrate, exposing spaced apart first, second and third areas of the substrate;
   covering the second and third areas while leaving exposed at least a portion of the first area;
   forming a first insulation region on the exposed portion of the first area;
   exposing the second and third areas; and
   forming a trench isolation region in the substrate, the trench isolation region spanning the second and third areas.

12. A method according to claim 11 wherein said step of forming a pattern region comprise the steps of:

forming a masking layer on the substrate; and patterning the masking layer using a single photolithographic mask.

13. A method according to claim 11 wherein said step of forming a first insulation region comprises the step of thermally oxidizing the exposed portion of the first area to thereby form the first insulation region.

14. A method according to claim 11 wherein the first area is wider than the second and third areas.

15. A method according to claim 11 wherein said step of forming a trench isolation region comprises the steps of:

forming two spaced apart trenches, each of the trenches being formed at a respective one of the second and third areas;

removing portions of the substrate between the two trenches to form a single trench; and forming a second insulation region in the single trench.

16. A method according to claim 15, wherein said step of forming a second insulation region comprises the steps of:

forming an insulation layer filling the single trench and covering the pattern region and the first insulation region; and planarizing the substrate to form a second insulation region in the single trench.

17. A method according to claim 16, wherein said step of forming an insulation layer is preceded by the step of thermally oxidizing exposed portions of the substrate in the single trench.

18. A method according to claim 16:

wherein said step of forming a pattern region comprises the steps of:

forming a barrier layer on the substrate;

forming a first insulation layer on the barrier layer; and patterning the barrier layer and the first insulation layer to form a pattern region on the substrate, exposing spaced apart first, second and third areas of the substrate;

wherein said step of planarizing the substrate comprises the step of chemical mechanical polishing the substrate using the barrier layer as a polishing stop.

19. A method according to claim 16:

wherein said step of forming a pattern region comprises the steps of:

forming a barrier layer on the substrate;

forming a first insulation layer on the barrier layer; and patterning the barrier layer and the first insulation layer to form a pattern region on the substrate, exposing spaced apart first, second and third areas of the substrate;

wherein said step of planarizing the substrate comprises the step of reactive ion etching the substrate using the barrier layer as an etching stop.

20. A method according to claim 11:

wherein said step of covering the second and third areas comprises the step of forming sidewall spacers adjacent sidewall portions of the pattern region, covering the second and third areas and leaving exposed at least a portion of the first area between sidewall spacers; and wherein said step of exposing the second and third areas comprises the step of removing the sidewall spacers covering the second and third areas.

21. A method according to claim 11 wherein the substrate includes a silicon region and a silicon dioxide layer at an upper surface thereof.

* * * * *